United States Patent [19]
Hanna

[11] Patent Number: 5,394,036
[45] Date of Patent: Feb. 28, 1995

[54] CIRCUIT AND METHOD OF ZERO GENERATION IN A REAL-TIME FILTER

[75] Inventor: John E. Hanna, Mesa, Ariz.

[73] Assignee: Motorola, Inc., Schaumburg, Ill.

[21] Appl. No.: 176,971

[22] Filed: Jan. 3, 1994

[51] Int. Cl.$^6$ .............................................. H04B 1/10
[52] U.S. Cl. .................................... 327/552; 327/311; 327/551
[58] Field of Search ...................... 307/520, 556, 562; 328/162, 163, 164, 165, 166, 167

[56] References Cited

U.S. PATENT DOCUMENTS

| | | | |
|---|---|---|---|
| 3,308,398 | 3/1967 | Chilton | 328/162 |
| 3,967,102 | 6/1976 | McCown | 328/167 |
| 3,979,684 | 9/1976 | Acker | 328/167 |
| 4,459,699 | 7/1984 | Monticelli et al. | 328/163 |
| 4,517,518 | 5/1985 | Ishigaki | 328/165 |
| 4,851,718 | 7/1989 | Hagino et al. | 328/167 |
| 4,954,785 | 9/1990 | Segaram | 328/167 |
| 5,051,628 | 9/1991 | Hanna | 307/520 |
| 5,140,198 | 8/1992 | Atherly et al. | 307/520 |
| 5,311,087 | 5/1994 | Suganuma | 328/165 |
| 5,317,217 | 5/1994 | Rieger et al. | 328/167 |

FOREIGN PATENT DOCUMENTS 63-41466  8/1988  Japan .

Primary Examiner—Terry D. Cunningham
Attorney, Agent, or Firm—Robert D. Atkins

[57] ABSTRACT

A real-time tracking filter circuit (10) that exhibits accurate zero placement is implemented in a monolithic structure by incorporating a three-input summing circuit (24) and a two-input summing circuit (28). The input signal (12) and a feedback signal (30) are summed and converted to a first current. The first current is integrated for providing a first integrated voltage (18). The first integrated voltage and an amplified input signal (40) and the feedback signal are summed and converted to a second current. The second current is integrated for providing a second integrated voltage as the feedback signal. The second integrated voltage and the amplified input signal are summed for providing the filtered output signal (36). Integration capacitors (20, 32) are grounded to remove parasitic effects that impact the pole-zero frequency response of the tracking filter output.

13 Claims, 1 Drawing Sheet

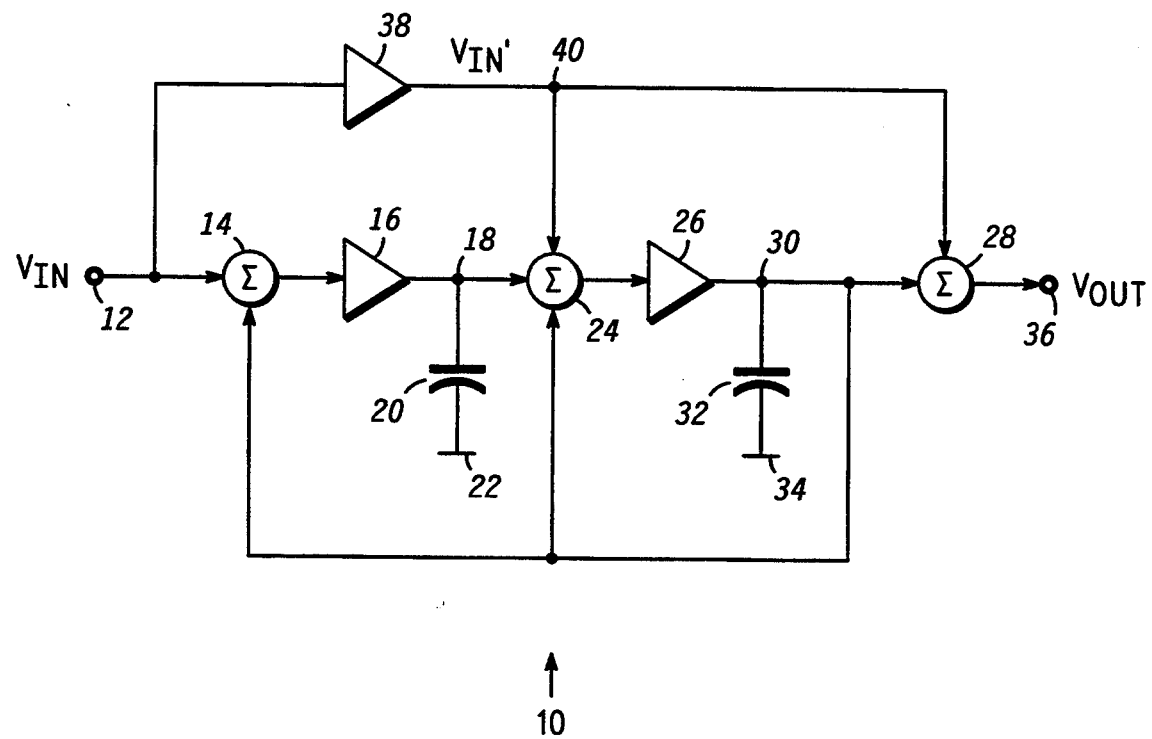

CIRCUIT AND METHOD OF ZERO GENERATION IN A REAL-TIME FILTER

BACKGROUND OF THE INVENTION

The present invention relates in general to real-time filters and, more particularly, to generation of zeroes for a real-time tracking filter circuit.

It is known in the art that hard disk drives and sampled data systems require optimized signal-to-noise ratios and demand matched transfer functions in order to achieve error rates of less than $10^{-11}$. In order to achieve the desired level of signal quality, such data communication systems incorporate peak detection techniques utilizing extremely accurate real-time tracking filters. The poles of these filters are typically located at frequencies up to 100 megahertz. Equally important are accurately placed associated zeros that influence the peaking characteristic of the filter.

In the past, the filtering function has been implemented by providing a differential input signal to a first summing block. The output of the first summing block is passed to a first transconductance block which in turn drives a second summing block. The second summing block further drives a second transconductance block that drives the first nodes of each of two integrating capacitors. Typically, a parallel path is established, with the input signal applied to a differential amplifying block whose outputs drive the second nodes of either or both the two integrating capacitors, respectively, thus completing the low-pass filtering response loop.

It is well known in the art that miniaturization of electronic circuits such as the aforedescribed low-pass filter circuit is highly desirable, and furthermore, it is known that monolithic integrated circuit structures provide economical and efficient means for miniaturization. However, a monolithic implementation of the low-pass filter circuit presents new obstacles that must be overcome in order to achieve the level of performance required in real-time data communication systems.

At each integration node located at the outputs of the transconductance blocks there is parasitic stray capacitance. The parasitic stray capacitance creates an attenuation effect that modifies the predicted pole-zero relationship of the low-pass filter. Attempts have been made to compensate the pole-zero response by adding a nominal parasitic capacitance. Unfortunately, the actual capacitance added is subject to processing variation and therefore difficult to control. Moreover, the additional capacitance requires additional drive from the amplifying blocks to maintain the desired filter response.

Hence, a need exists for a low-pass filter circuit with a response that can be effectively and predictably peaked, and furthermore, is insensitive to the adverse effects of stray parasitic capacitance.

BRIEF DESCRIPTION OF THE DRAWING

The sole FIGURE is a block diagram illustrating a low-pass filter.

Detailed Description of the Preferred Embodiment

Referring to the sole figure, a low-pass filter circuit 10 is shown suitable for manufacturing as an integrated circuit using conventional integrated circuit processes. Filter circuit 10 includes summing circuit 14 having a first input 12 receiving a filter input signal $V_{IN}$. Filter circuit 10 is shown processing single-ended signals. It is understood that the filter input signal $V_{IN}$ may be differential in which case the components of filter circuit 10 would process differential signals.

The output of summing circuit 14 is coupled to an input of transconductance amplifier 16. Summing circuit 14 sums the filter input signal $V_{IN}$ and a feedback signal from transconductance amplifier 26 for providing a first summation signal into transconductance amplifier 16. The output of amplifier 16 provides a current signal into node 18 to develop a voltage across capacitor 20. Integrating capacitor 20 is coupled between node 18 and node 22 which operates at an AC ground potential. Capacitor 20 integrates the first current and provides a first integrated voltage. Summing circuit 24 has a first input coupled to node 18 for receiving the first integrated voltage signal. Summing circuit 24 further includes a second input coupled for receiving an amplified input signal $V_{IN}'$ from amplifier 38 and a third input coupled for receiving the feedback signal from node 30. The output of summing circuit 24 provides a second summation signal to an input of transconductance amplifier 26. The output of amplifier 26 provides a second current signal into node 30 to develop a voltage across capacitor 32. Integrating capacitor 32 is coupled between node 30 and node 34 which operates at the same AC ground potential as node 22. Alternately, nodes 22 and 34 may provide feedback compensation to amplifiers 16 and 26 when configured differentially. Capacitor 32 thus integrates the second current and provides a second integrated voltage as the feedback signal. Summing circuit 28 has a first input coupled to node 30 for receiving the second integrated voltage signal. Summing circuit 28 further includes a second input coupled for receiving the amplified input signal $V_{IN}'$ from amplifier 38. The output from summing circuit 28 is the filter output signal $V_{OUT}$ at output 36.

A parallel feed forward path comprises an amplifier 38 having an input coupled for receiving the filter input signal $V_{IN}$. Amplifier 38 provides an amplified (or attenuated) input signal $V_{IN}'$ at node 40 to the second input of summing circuit 28 and to the third input of summing circuit 24. Amplifier 38 has a gain or attenuation depending upon the desired relationship of poles to zeroes, say from 0.1 to 10.

In general, the present disclosure presents a technique in which voltage signals may be added to the low-pass filter network with AC grounded integration capacitors 20 and 32 to produce a filter response with both poles and zeros in the transfer function. Integration capacitors 20 and 32 are grounded to remove parasitic effects that impact the pole-zero frequency response of the tracking filter output. By appropriate choice of gain ratios to the applied input signal, the desired zeros on the real and imaginary axis can be obtained.

A key feature of the present invention is the use of summing circuit 28 and the third input to summing circuit 24. Summing circuit 28 adds input voltage $V_{IN}'$ to output 36 as determined by the gain or attenuation of amplifier 38. In addition, the input signal $V_{IN}'$ is added to the output of summing circuit 24 by way of its third input. Summing the amplified input signal $V_{IN}'$ through summing circuits 24 and 28 provides zero terms in the numerator of the transfer function to achieve the desired peaked low-pass filter operation. The summing circuit gains are well defined and independent of parasitic capacitance. The driving point impedance of the summing circuit inputs are typically high and resistive, making driving easy and requiring low power. Nodes 22 and 34 are available for use in common-mode compensation loops when the circuit is configured differentially.

If amplifier 38 is set to zero gain, the circuitry from input 12 to node 30 forms a two-pole low-pass filter, commonly called a transconductance capacitor filter. Under this condition the gain to node 30 from input 12 with amplifier 38 disabled is given by the transfer function:

$$\frac{V_{30}}{V_{12}} = \frac{1}{s^2 \cdot \frac{C_{20} \cdot C_{32}}{G_{M16} \cdot G_{M26}} + K_{242} \cdot s \frac{C_{20}}{G_{M16}} + K_{142}} \quad (1)$$

where:

$K_{241}$, $K_{242}$, $K_{243}$ are the first, second and third input gains of summing circuit 24. $K_{241}$ is unity.

$K_{141}$, $K_{142}$ are the first and second input gains of summing circuit 14. $K_{141}$ is unity.

$C_{20}$ is value of capacitor 20.

$C_{32}$ is value of capacitor 32.

$G_{M16}$ is transconductance of amplifier 16.

$G_{M26}$ is transconductance of amplifier 26.

When the gain of amplifier 38 is non-zero, the amplified input signal $V_{IN}'$ produces the desired transfer function to output 36 from input 12 as:

$$\frac{V_{36}}{V_{12}} = \frac{s^2 A_{38} \cdot K_{282} \cdot \frac{C_{20} \cdot C_{32}}{G_{M16} \cdot G_{M26}} + s \frac{C_{20}}{G_{M16}} (K_{242} \cdot A_{38} \cdot K_{282} - A_{38} \cdot K_{243}) + K_{142} \cdot A_{38} \cdot K_{282} + 1 - K_{141}}{s^2 \frac{C_{20} \cdot C_{32}}{G_{M16} \cdot G_{M26}} + K_{242} \cdot s \frac{C_{20}}{G_{M16}} + K_{142}} \quad (2)$$

where:

$A_{38}$ is the voltage gain of amplifier 38.

$K_{281}$, $K_{282}$ are the first and second input gains of summing circuit 28, respectively.

The zero locations in the numerator of equation (2) can be scaled by appropriated choice of amplifier and summer gain factors.

In summary, the present invention provides a real-time filter circuit with an output response insensitive to parasitic circuit effects. The configuration of the feed forward loop through amplifier 38 and the arrangement of capacitors 20 and 32 in the circuit negates the effect of stray capacitance. Summing circuits 24 and 28 receive the amplified input signal from amplifier 38 to compensate for stray nodal capacitance and set the desired pole-zero response of the low-pass filter.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A filter circuit responsive to an input signal for providing an output signal, comprising:

first means for summing the input signal and a feedback signal for providing a first summation signal;

second means coupled for receiving said first summation signal for converting said first summation signal to a first current;

third means coupled for receiving said first current for integrating said first current and providing a first integrated voltage;

fourth means coupled for summing said first integrated voltage and an amplified input signal and said feedback signal for providing a second summation signal;

fifth means coupled for receiving said second summation signal for converting said second summation signal to a second current;

sixth means coupled for receiving said second current for integrating said second current and providing a second integrated voltage as said feedback signal; and seventh means coupled for receiving said second integrated voltage for summing said second integrated voltage and said amplified input signal for providing the output signal of the filter circuit.

2. The filter circuit of claim 1 further including an amplifier having an input coupled for receiving the input signal and having an output for providing said amplified input signal.

3. The filter circuit of claim 2 wherein said first means includes a first summation circuit having first and second inputs and an output, said first input being coupled for receiving the input signal, said second input being coupled for receiving said feedback signal, said output providing said first summation signal.

4. The filter circuit of claim 3 wherein said second means includes a first transconductance amplifier having an input coupled for receiving said first summation signal and having an output for providing said first current.

5. The filter circuit of claim 4 wherein said third means includes a first capacitor coupled between said output of said first transconductance amplifier and a first node at which a first potential is applied.

6. The filter circuit of claim 5 wherein said fourth means includes a second summation circuit having first, second and third inputs and an output, said first input being coupled for receiving said first integrated voltage, said second input being coupled for receiving said amplified input signal, said third input being coupled for receiving said feedback signal, said output providing said second summation signal.

7. The filter circuit of claim 6 wherein said fifth means includes a second transconductance amplifier having an input coupled for receiving said second summation signal and having an output for providing said second current.

8. The filter circuit of claim 7 wherein said sixth means includes a second capacitor coupled between said output of said second transconductance amplifier and a second node at which a second potential is applied.

9. The filter circuit of claim 8 wherein said seventh means includes a third summation circuit having first and second inputs and an output, said first input being coupled for receiving said second integrated voltage, said second input being coupled for receiving said amplified input signal, said output providing the output signal of the filter circuit.

10. A method of filtering an input signal for providing a filtered output signal, comprising the steps of:

summing an input signal and a feedback signal for providing a first summation signal;

converting said first summation signal to a first current;

integrating said first current and providing a first integrated voltage;

summing said first integrated voltage and an amplified input signal and said feedback signal for providing a second summation signal;

converting said second summation signal to a second current;

integrating said second current and providing a second integrated voltage as said feedback signal; and summing said second integrated voltage and said amplified input signal for providing the filtered output signal.

11. The method of claim 10 further including the step of amplifying the input signal for providing said amplified input signal.

12. A filter circuit responsive to an input signal for providing an output signal, comprising:

a first summation circuit having first and second inputs and an output, said first input being coupled for receiving the input signal, said second input being coupled for receiving a feedback signal, said output providing a first summation signal;

a first transconductance amplifier having an input coupled for receiving said first summation signal and having an output for providing a first current;

a first capacitor coupled between said output of said first transconductance amplifier and a first node for integrating said first current and providing a first integrated voltage, said first node being coupled for receiving a first potential;

a second summation circuit having first, second and third inputs and an output, said first input being coupled for receiving said first integrated voltage, said second input being coupled for receiving an amplified input signal, said third input being coupled for receiving said feedback signal, said output providing a second summation signal;

a second transconductance amplifier having an input coupled for receiving said second summation signal and having an output for providing a second current;

a second capacitor coupled between said output of said second transconductance amplifier and a second node for integrating said second current and providing a second integrated voltage as said feedback signal, said second node being coupled for receiving a second potential; and a third summation circuit having first and second inputs and an output, said first input being coupled for receiving said second integrated voltage, said second input being coupled for receiving said amplified input signal, said output providing the output signal of the filter circuit.

13. The filter circuit of claim 12 further including an amplifier having an input coupled for receiving the input signal and having an output for providing said amplified input signal.

* * * * *